United States Patent
Meguro

(10) Patent No.: US 8,269,343 B2
(45) Date of Patent: Sep. 18, 2012

(54) SEMICONDUCTOR DEVICE INCLUDING A PRESSURE-CONTACT SECTION

(75) Inventor: Kouichi Meguro, Kanagawa (JP)

(73) Assignee: Spansion LLC, Sunnyvale, CA (US)

( * ) Notice: Subject to any disclaimer, the term of this patent is extended or adjusted under 35 U.S.C. 154(b) by 536 days.

(21) Appl. No.: 12/234,337

(22) Filed: Sep. 19, 2008

(65) Prior Publication Data

US 2009/0236721 A1    Sep. 24, 2009

(30) Foreign Application Priority Data

Sep. 19, 2007    (JP) ................. 2007-241761

(51) Int. Cl.
*H01L 23/34* (2006.01)

(52) U.S. Cl. . 257/724; 257/725; 257/726; 257/E23.002; 257/E23.048; 257/E23.078

(58) Field of Classification Search ......... 257/723, 257/724, 725, 726, E23.002, E23.048, E23.078
See application file for complete search history.

(56) References Cited

U.S. PATENT DOCUMENTS

| | | | | |
|---|---|---|---|---|
| 4,841,355 A * | 6/1989 | Parks | ............ | 257/686 |
| 5,332,922 A * | 7/1994 | Oguchi et al. | ............ | 257/723 |
| 5,563,450 A * | 10/1996 | Bader et al. | ............ | 257/785 |
| 5,657,537 A * | 8/1997 | Saia et al. | ............ | 29/830 |
| RE37,539 E * | 2/2002 | Oguchi et al. | ............ | 257/686 |
| 6,686,655 B2 * | 2/2004 | Moden et al. | ............ | 257/686 |
| 7,145,226 B2 * | 12/2006 | Kumamoto | ............ | 257/686 |
| 7,598,617 B2 * | 10/2009 | Lee et al. | ............ | 257/777 |
| 2002/0048158 A1 * | 4/2002 | Hashimoto | ............ | 361/803 |
| 2004/0036164 A1 * | 2/2004 | Koike et al. | ............ | 257/723 |
| 2004/0178496 A1 * | 9/2004 | Rapport et al. | ............ | 257/723 |
| 2006/0001142 A1 * | 1/2006 | Jeung et al. | ............ | 257/686 |
| 2006/0138647 A1 * | 6/2006 | Crisp et al. | ............ | 257/723 |
| 2006/0138649 A1 * | 6/2006 | Karnezos | ............ | 257/723 |

FOREIGN PATENT DOCUMENTS

| | | |
|---|---|---|
| JP | 3-177033 | 8/1991 |
| JP | 07-014979 | 1/1995 |
| JP | 8008389 | 1/1996 |
| JP | 08-172147 | 7/1996 |
| JP | 08-212044 | 8/1996 |
| JP | 10-022839 | 1/1998 |
| JP | 11-243174 | 9/1999 |
| JP | 2001-196504 | 7/2001 |
| JP | 2002076175 | 3/2002 |
| JP | 2002-76175 | 9/2003 |
| JP | 2005072147 | 3/2005 |
| JP | 2005-72147 | 12/2005 |

* cited by examiner

*Primary Examiner* — Ngan Ngo

(57) ABSTRACT

A semiconductor device in accordance with one embodiment of the invention can include a substrate onto which a wiring pattern is formed. In addition, the semiconductor device can include a plurality of semiconductor packages. Each semiconductor package can include a lead frame that is coupled to an electrode of a semiconductor chip. Each lead frame can be located on a side surface and a bottom surface of the semiconductor package. In addition, the semiconductor device can include a pressure-contact section for receiving the plurality of semiconductor packages and for causing the plurality of semiconductor packages to come into contact with the wiring pattern.

20 Claims, 21 Drawing Sheets

SEMICONDUCTOR DEVICE INCLUDING A PRESSURE-CONTACT SECTION

CROSS-REFERENCE TO RELATED APPLICATIONS

This patent application claims the benefit and priority of the co-pending Japanese Patent Application No. 2007-241761, filed on Sep. 19, 2007, which is hereby incorporated by reference in its entirety.

BACKGROUND

Semiconductor devices are currently found in a wide variety of items, such as, automobiles, Global Positioning System (GPS) devices, large and small computers or computing devices, mobile phones, MP3 players, DVD players, and the like. It is noted that semiconductor devices can be manufactured in a wide variety of ways. For example, a multi-chip package (MCP) is one conventional technique for stacking semiconductor chips in a package. Furthermore, Package-on-Package (PoP) is a conventional technique for stacking packages. However, it is pointed out that there are disadvantages associated with both of these techniques. For example, once a plurality of semiconductor chips are packaged using MCP and/or PoP, if there is any failure of one of the semiconductor chips, the complete package is disposed of even though it includes operational chips. As a result, the manufacturing costs increase and the manufacturing yield are poor.

SUMMARY

Various embodiments in accordance with the invention can include a semiconductor device and a manufacturing method thereof in which stacking of semiconductor packages can be performed without hindering miniaturization of the semiconductor device while enabling operable semiconductor packages to be re-used.

A semiconductor device in accordance with one embodiment of the invention can include a substrate onto which a wiring pattern is formed. In addition, the semiconductor device can include a plurality of semiconductor packages. Each semiconductor package can include a lead frame that is coupled to an electrode of a semiconductor chip. Each lead frame can be located on a side surface and a bottom surface of the semiconductor package. In addition, the semiconductor device can include a pressure-contact section for receiving the plurality of semiconductor packages and for causing the plurality of semiconductor packages to come into contact with the wiring pattern.

In an embodiment, there is provided a semiconductor device comprising: a mother substrate (or substrate) onto which a wiring pattern is formed; a semiconductor package that includes a lead frame that is connected to an electrode of a semiconductor chip and is provided at least in a side surface direction of the semiconductor chip and in a bottom surface direction of the semiconductor chip; a pressure-contact section onto which pluralities of the semiconductor package are stacked and which makes pluralities of the lead frame provided in pluralities of the semiconductor package abut against each other to thereby bring pluralities of the lead frame of a lowermost semiconductor package from amongst pluralities of the semiconductor package into pressure-contact with the wiring pattern.

In one embodiment, the semiconductor package comprises a lead frame that is connected to an electrode of a semiconductor chip and is provided at least in a side surface direction of the semiconductor chip and in a bottom surface direction of the semiconductor chip. Thus, establishment of a connection of the electrodes with the lead frame does not require lead wires and molding section that seals the lead wire. Since the semiconductor according to the first aspect of the invention does not require the molding section in the semiconductor package, even when stacking a plurality of semiconductor packages, thickness of the molding section is not added to the thickness of each of the semiconductor packages. The semiconductor device according to the first aspect of the invention does not add the thickness of the molding section to the thickness of each of the semiconductor packages when stacking a plurality of semiconductor packages. Therefore, increase in height of stacked semiconductor packages can be restrained to thereby meet the need for miniaturization of a semiconductor device in which a plurality of semiconductor packages are stacked.

In an embodiment, the pressure-contact section stacks a plurality of semiconductor packages and makes lead frames provided in the plurality of semiconductor packages abut against each other to thereby bring the lead frame of the lowermost semiconductor package from amongst the plurality of semiconductor packages into pressure-contact with the wiring pattern. Different from the case where lead frames provided in a plurality of semiconductor packages are fixed with solder, warpage caused by an increase in temperature at the time of heating the solder is unlikely to occur in the semiconductor chip provided in the semiconductor package. Accordingly, in the semiconductor device of the first aspect of the invention stacking of the semiconductor packages is not hindered by the warpage in the semiconductor chip, thereby allowing a plurality of semiconductor packages to be easily stacked.

In addition, in one embodiment, lead frames provided in a plurality of semiconductor packages are made abut against each other and then the lead frame of the lowermost semiconductor package from amongst the plurality of semiconductor packages is brought into pressure-contact with the wiring pattern. Different from the case where lead frames are fixed with use of solder, the fixed state of a plurality of semiconductor packages can be easily released. Therefore, according to the semiconductor device of the first aspect of the present invention, if a good semiconductor package is found in a plurality of semiconductor packages that are separated, the good semiconductor package can be picked out and re-used.

A method in accordance with one embodiment of the invention for manufacturing a semiconductor device can include manufacturing a substrate onto which a wiring pattern is formed. Furthermore, the method can include manufacturing a plurality of semiconductor packages wherein each semiconductor package comprises a lead frame that is coupled to an electrode of a semiconductor chip and the lead frame is located on a side surface and a bottom surface of the semiconductor package. In addition, the method can include causing the plurality of semiconductor packages to come into contact with the wiring pattern via a pressure-contact section of said semiconductor device.

According to an embodiment of the invention, there is provided a method of manufacturing a semiconductor device, comprising the operations of: manufacturing a mother substrate onto which a wiring pattern is formed; manufacturing a semiconductor package that includes a lead frame that is connected to an electrode of a semiconductor chip and is provided at least in a side surface direction of the semiconductor chip and in a bottom surface direction of the semiconductor chip; pressure-contact for bringing, by stacking pluralities of the semiconductor package and making the lead frame provided in pluralities of the semiconductor package abut against each other, the lead frame of a lowermost semiconductor package from amongst pluralities of the semiconductor package into pressure-contact with the wiring pattern.

In one embodiment, the operation of manufacturing the semiconductor package manufactures a semiconductor package that comprises a lead frame that is connected to an electrode of a semiconductor chip and is provided at least in a side surface direction of the semiconductor chip and in a bottom surface direction of the semiconductor chip. Thus, in the semiconductor package manufactured by such method, establishment of a connection of the electrodes with the lead frame does not require lead wires and molding section that seals the lead wire. Since the manufacturing method of the semiconductor according to the second aspect of the invention does not require the molding section in the semiconductor package, even when stacking a plurality of semiconductor packages, thickness of the molding section is not added to the thickness of each of the semiconductor packages. The manufacturing method of the semiconductor device according to the second aspect of the invention does not add the thickness of the molding section to the thickness of each of the semiconductor packages when stacking a plurality of semiconductor packages. Therefore, the increase in height of stacked semiconductor packages can be restrained to thereby meeting the need for miniaturization of a semiconductor device in which a plurality of semiconductor packages are stacked.

In an embodiment, the operation of pressure-contacting stacks a plurality of semiconductor packages and makes lead frames provided in the plurality of semiconductor packages abut against each other to thereby bring the lead frame of the lowermost semiconductor package from amongst the plurality of semiconductor packages into pressure-contact with the wiring pattern. Different from the case where lead frames provided in a plurality of semiconductor packages are fixed with solder, warpage caused by an increase in temperature at the time of heating the solder is unlikely to occur in the semiconductor chip provided in the semiconductor package. Accordingly, in the manufacturing method of the semiconductor device of the second aspect of the invention, stacking of the semiconductor packages is not hindered by the warpage in the semiconductor chip, thereby allowing a plurality of semiconductor packages to be easily stacked.

In addition, in one embodiment, a plurality of semiconductor packages are stacked, lead frames provided in the plurality of semiconductor packages are made abut against each other and then the lead frame of the lowermost semiconductor package from amongst the plurality of semiconductor packages is pressure-contact with the wiring pattern. Different from fixing lead frames with use of solder, the fixed state of a plurality of semiconductor packages can be easily released. Therefore, according to the manufacturing method of the semiconductor device of the second aspect of the present invention, if a good semiconductor package is found in a plurality of semiconductor packages that are separated, the good semiconductor package can be picked out and re-used.

In one embodiment, the semiconductor package comprises a lead frame that is connected to an electrode of a semiconductor chip and is provided at least in a side surface direction of the semiconductor chip and in a bottom surface direction of the semiconductor chip. Thus, establishment of a connection of the electrodes with the lead frame does not require lead wires and molding section that seals the lead wire. Since the semiconductor according to an embodiment does not involve the molding section in the semiconductor package, even when stacking a plurality of semiconductor packages, thickness of the molding section is not added to the thickness of each of the semiconductor packages. The semiconductor device according to an embodiment does not add the thickness of the molding section to the thickness of each of the semiconductor packages when stacking a plurality of semiconductor packages. Therefore, increase in height of stacked semiconductor packages can be restrained to thereby meet the need for miniaturization of a semiconductor device in which a plurality of semiconductor packages are stacked.

In an embodiment, a plurality of semiconductor packages are stacked and lead frames provided in the plurality of semiconductor packages are made to abut against each other to thereby bring the lead frame of the lowermost semiconductor package from amongst the plurality of semiconductor packages into pressure-contact with the wiring pattern. Different from the case where lead frames provided in a plurality of semiconductor packages are fixed with solder, warping caused by an increase in temperature at the time of heating the solder is unlikely to occur in the semiconductor chip provided in the semiconductor package. Accordingly, to an embodiment, stacking of the semiconductor packages is not hindered by the warpage in the semiconductor chip, thereby allowing a plurality of semiconductor packages to be easily stacked.

In addition, in an embodiment, lead frames provided in a plurality of semiconductor packages are made abut against each other and then the lead frame of the lowermost semiconductor package from amongst the plurality of semiconductor packages is brought into pressure-contact with the wiring pattern. Different from fixing lead frames with use of solder, the fixed state of a plurality of semiconductor packages can be easily released. Therefore, in an embodiment, if a good or operable semiconductor package is found in a plurality of semiconductor packages that are separated, the good semiconductor package can be picked out and re-used.

While particular embodiments in accordance with the invention have been specifically described within this Summary, it is noted that the invention is not limited to these embodiments. The invention is intended to cover alternatives, modifications and equivalents which may be included within the scope of the invention as recited by the Claims.

DETAILED DESCRIPTION

Reference will now be made in detail to various embodiments in accordance with the invention, examples of which are illustrated in the accompanying drawings. While the invention will be described in conjunction with various embodiments, it will be understood that these various embodiments are not intended to limit the invention. On the contrary, the invention is intended to cover alternatives, modifications and equivalents, which may be included within the scope of the invention as construed according to the Claims. Furthermore, in the following detailed description of various embodiments in accordance with the invention, numerous specific details are set forth in order to provide a thorough understanding of the invention. However, it will be evident to one of ordinary skill in the art that the invention may be practiced without these specific details. In other instances, well known methods, procedures, components, and circuits have not been described in detail as not to unnecessarily obscure aspects of the invention.

Figure 1:
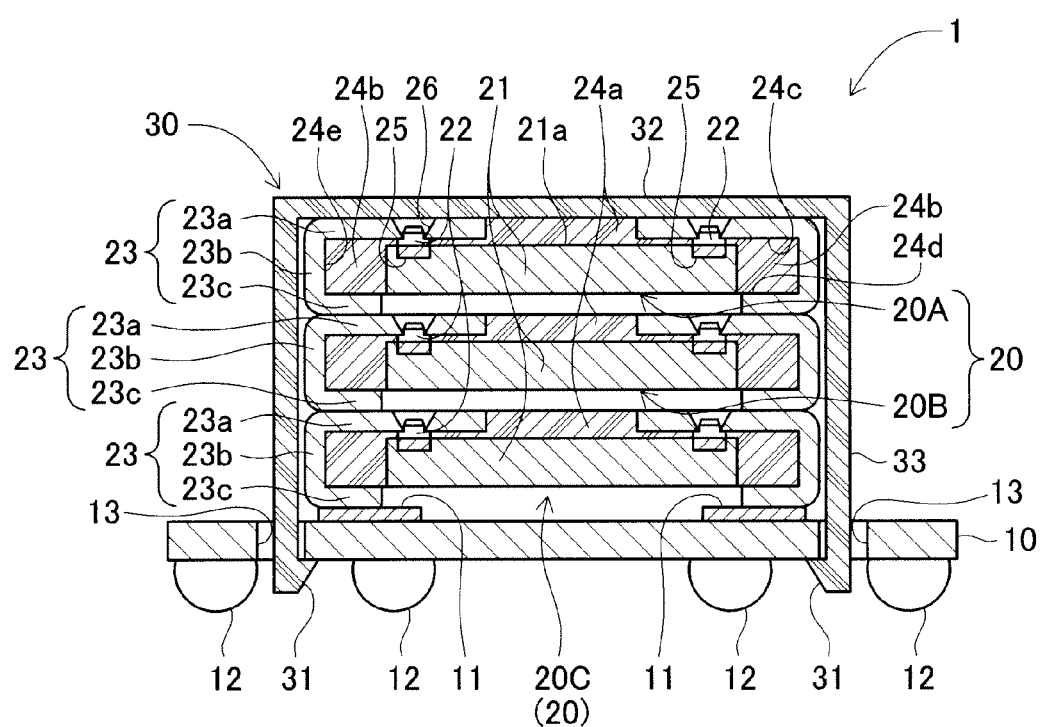
FIG. 1 is a schematic cross-sectional diagram of the semiconductor device in accordance with an embodiment of the invention.

A first embodiment of the present invention will be described while referring to FIG. 1. FIG. 1 is a schematic cross-section diagram of a semiconductor device according to the first embodiment of the present invention. Semiconductor device 1 is provided with a mother substrate (or substrate) 10, a semiconductor package 20 and a semiconductor package housing case 30.

Wiring patterns 11 are formed on an upper surface of the mother substrate 10. Solder balls 12 are attached to a lower surface of the mother substrate 10. Through holes 13 are provided in the mother substrate 10. In the present embodiment, four through holes 13 are provided in the mother substrate 10.

The semiconductor package 20 is provided with flip chips 21, metal bumps 22, lead frames 23 and molding sections 24. A flip chip 21 corresponds to a semiconductor chip of the present invention.

Electrodes 25 are provided at both ends of the flip chip 21. In FIG. 1, numerical symbol 25 is illustrated only with reference to a flip chip 21 provided in the semiconductor package 20A, but electrodes 25 are also provided in the flip chips 21 provided in the semiconductor package 20B and semiconductor package 20C. Electrodes 25 are connected to the metal bumps 22, respectively.

A lead frame 23 is provided with a first lead frame 23a, a second lead frame 23b and a third lead frame 23c. The first lead frame 23a is arranged along a bottom surface 21a of the flip chip 21 and a lower surface 24c of the molding section 24b to be described later. The first lead frame 23a is provided with through holes 26. Metal bumps 22 are fitted into the through holes 26. Through holes 26 correspond to the fitting recesses of the present invention.

The second lead frame 23b is arranged along a side surface 24e of the molding section 24b to be described later. The third lead frame 23c is arranged along an upper surface 24d of the molding section 24b.

The molding section 24 is formed to integrate the flip chip 21 with the lead frame 23. An edge surface of the molding section 24a is made flush with an edge surface of the first lead frame 23a. The molding section 24b is formed so as to fill a space provided between a side surface of the flip chip 21 and the lead frame 23.

The third lead frame 23c of the semiconductor package 20A is mounted on the first lead frame 23a of the semiconductor package 20B. The third lead frame 23c of the semiconductor package 20B is mounted on the first lead frame 23a of the semiconductor package 20C. The third lead frame 23c of the semiconductor package 20C is mounted on the wiring patterns 11.

The semiconductor package housing case 30 is provided with claws (or fasteners or connectors or latches) 31, a top plate 32 and side plates 33. The semiconductor package housing case 30 is formed of an epoxy resin. The claws (or fasteners) 31 are engaged with a lower surface of the mother substrate 10. The claws 31 correspond to the engaging claws (or fasteners) of the present invention.

The top plate 32 abuts against the first lead frame 23a of the semiconductor package 20A. The side plates 33 abuts against the second lead frame 23b provided in each of the respective semiconductor packages 20A through 20C.

Figure 2:
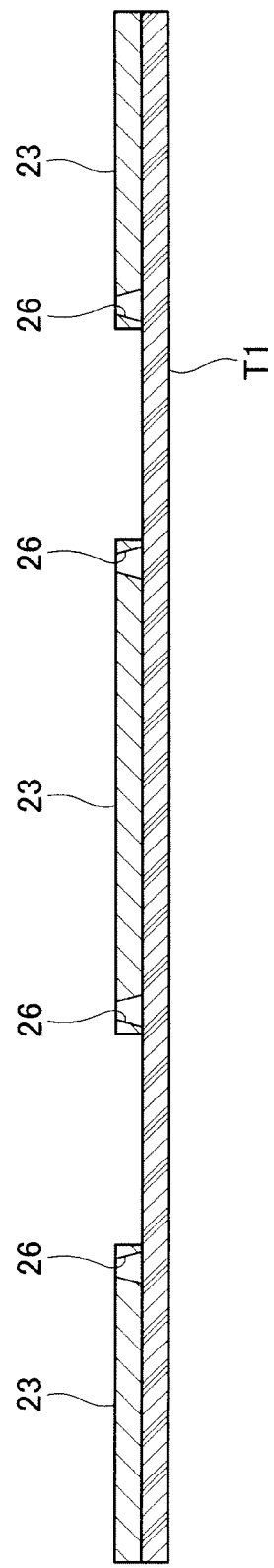
FIG. 2 is an exemplary diagram of a lead frame fixing process, in accordance with an embodiment of the invention.

Next, a manufacturing method of the semiconductor device 1 will be described. First, the manufacturing method of the semiconductor package 20 provided in the semiconductor device 1 will be described while referring to FIG. 2 through FIG. 12. In the manufacturing process of the semiconductor package 20, a lead frame fixing process is carried out first, as shown in FIG. 2. In the lead frame fixing process, tape T1 is attached to the bottom surface of the lead frame 23. An adhesive film is used in Tape T1. Through holes 26 are formed in advance in the lead frame 23.

Figure 3:
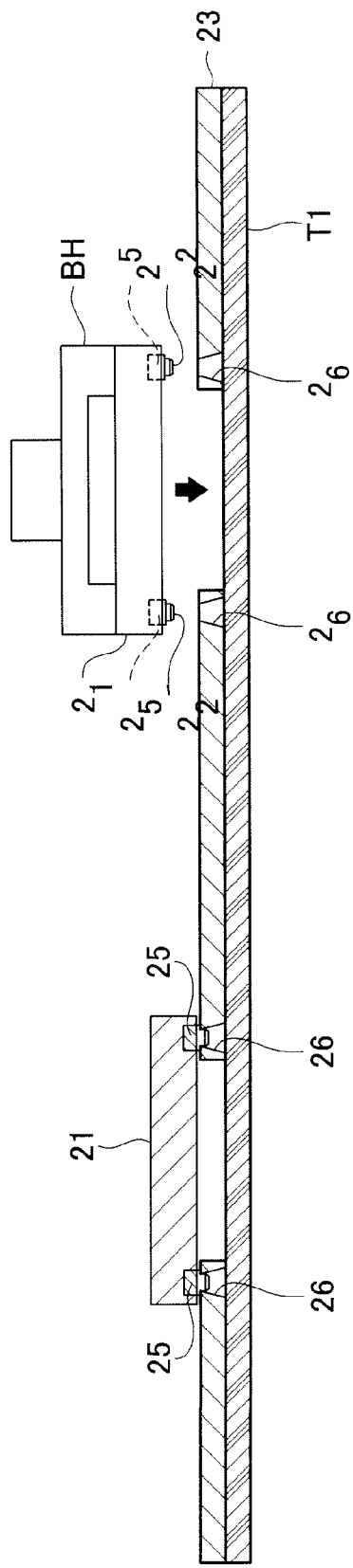
FIG. 3 is an exemplary diagram of a flip chip mounting process, in accordance with an embodiment of the invention.

After the lead frame fixing process, a flip chip mounting process is carried out as shown in FIG. 3. In the flip chip mounting process, the flip chip 21 is sucked by a bonding head BH. The bonding head BH forces the metal bumps 22 of the flip chip 21 into the through holes 26 of the lead frame 23. As a result, the metal bumps 22 are fitted into the through holes 26, thereby ensuring an electrical conductive state between the electrodes 25 of the flip chip 21 and the lead frame 23. After the metal bumps 22 are fitted in the through holes 26, the suctioning state between the bonding head BH and the flip chip 21 is released.

Figure 4:
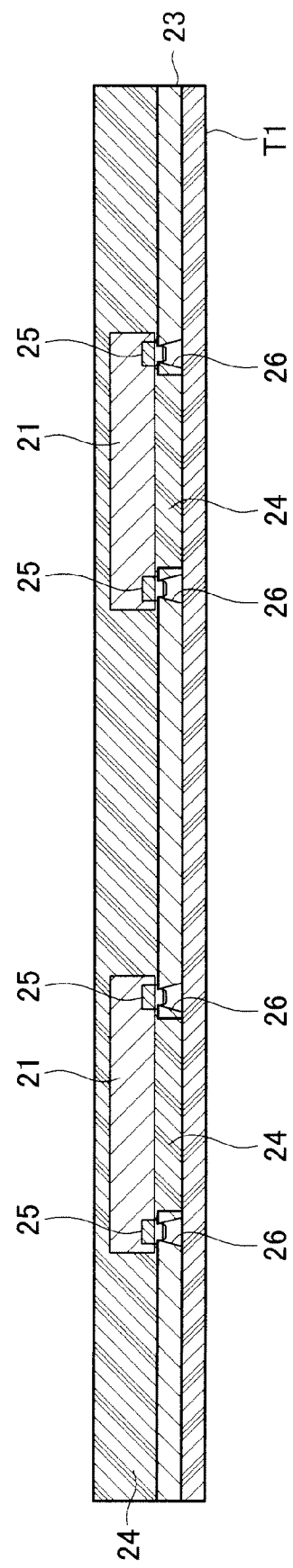
FIG. 4 is an exemplary diagram of a resin molding process, in accordance with an embodiment of the invention.

Following the flip chip mounting process, a resin molding process is carried out as shown in FIG. 4. In the resin molding process, the lead frame 23 which is made integral with the flip chip 21 is arranged inside a mold. Then, resin is injected into the mold, and the injected resin is then heated and cured. As a result, the flip chip 21 and the lead frame 23 are made integral with the molding section 24.

Figure 5:
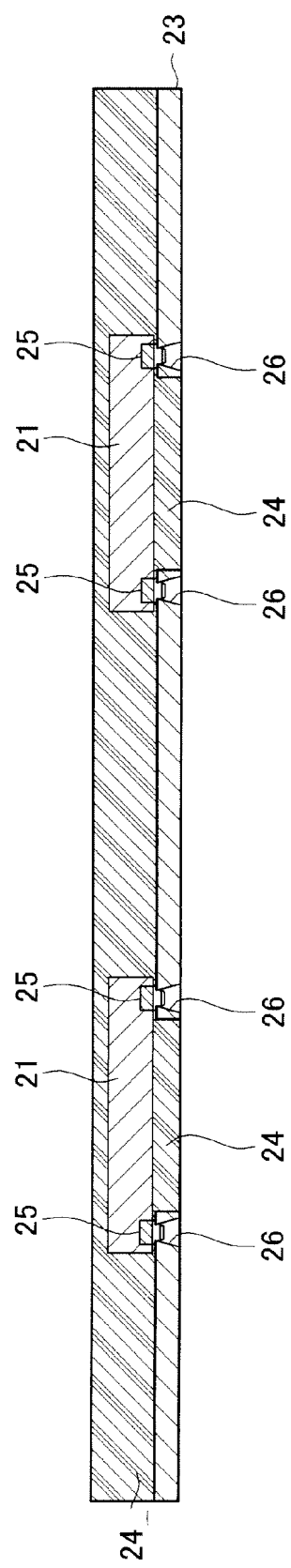
FIG. 5 is an exemplary diagram of a tape peeling process, in accordance with an embodiment of the invention.

After the resin molding process, a tape peeling process is carried out as shown in FIG. 5. In the tape peeling process, the tape T1 attached to the bottom surface of the lead frame 23 (refer to FIG. 4) is removed.

Figure 6:
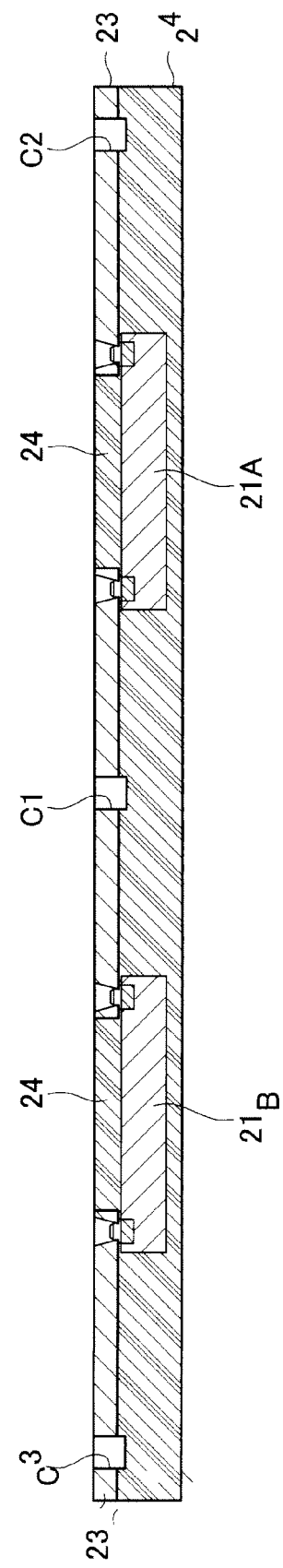
FIG. 6 is an exemplary diagram of a lead frame dicing process, in accordance with an embodiment of the invention.

After the tape peeling process, a lead frame dicing process is carried out as shown in FIG. 6. In the lead frame dicing process, a cut section C1 is formed by a laser cutter, for instance, to thus separate the lead frame 23 that is integral with the flip chip 21A from the lead frame 23 that is integral with the flip chip 21B. Further, cut sections C2 and C3 are formed by the laser cutter to adjust the lead frames 23 of the flip chips 21A and 21B to a predetermined length. The position of the cut sections C2 and C3 is determined accordingly in accordance with the shape of the lead frames to be formed in the flip chips 21A and 21B.

Figure 7:
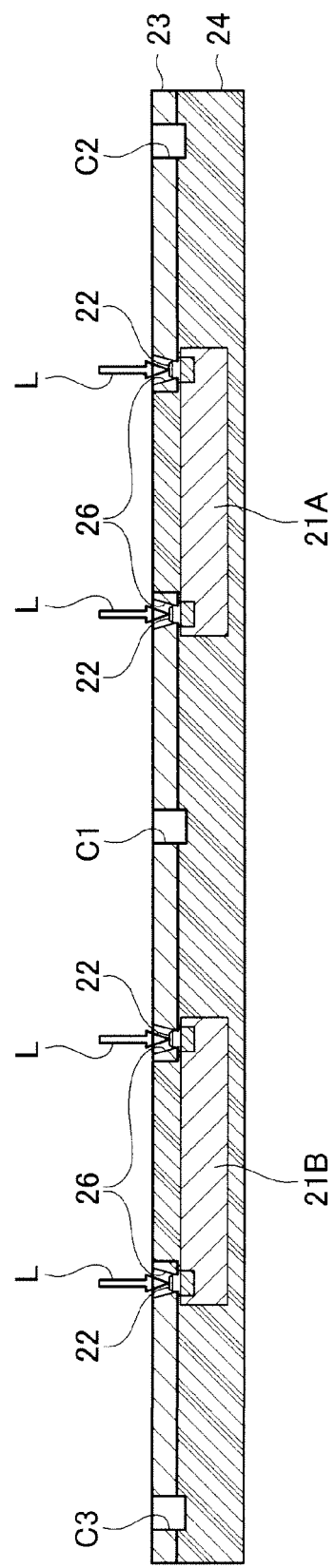
FIG. 7 is an exemplary diagram of a metal bump welding process, in accordance with an embodiment of the invention.

After the lead frame dicing process, a metal bump welding process is executed as shown in FIG. 7. In the metal bump welding process, a laser beam L is irradiated from a semiconductor laser element which is not shown, onto a fitting portion of the metal bumps 22 with the through holes 26. The metal bumps 22 are fixed to the through holes 26 by laser welding, in addition to being fitted into the through holes 26.

Figure 8:
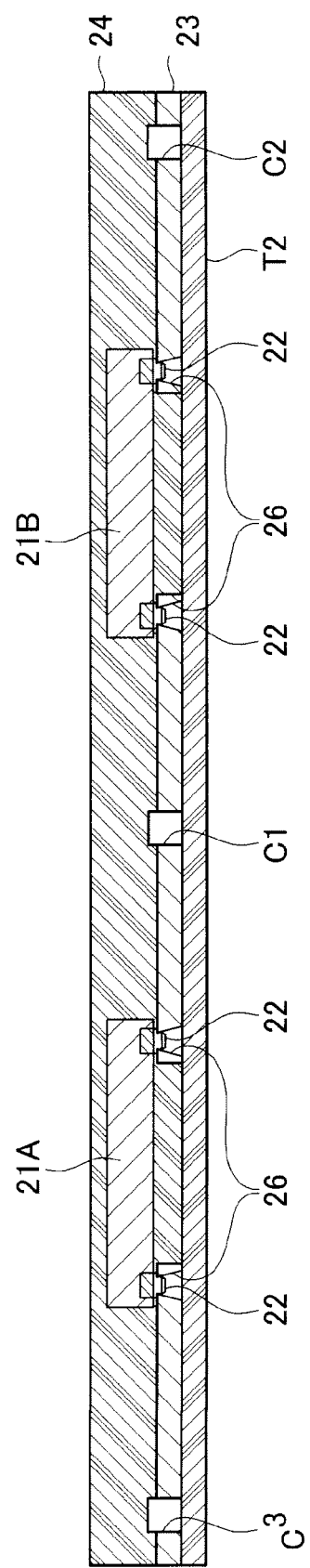
FIG. 8 is an exemplary diagram of a protective tape attaching process, in accordance with an embodiment of the invention.

After the metal bump welding process, a protective tape attaching process is carried out as shown in FIG. 8. In the protective tape attaching process, protective tape T2 is attached onto the lead frame 23 in which metal bumps 22 are fixed into the through holes 26 by laser welding.

Figure 9:
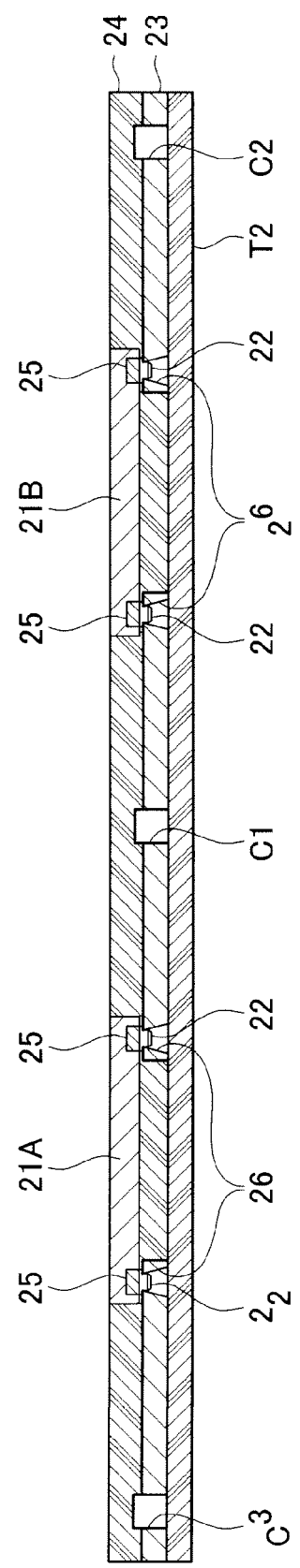
FIG. 9 is an exemplary diagram of a trimming process, in accordance with an embodiment of the invention.

Following the protective tape attaching process, a trimming process is executed as shown in FIG. 9. In the trimming process, the molding section 24 and the flip chips 21A and 21B are scraped off. As a result, the molding section 24 and the flip chips 21A and 21B are shaped to have a predetermined thickness.

Figure 10:
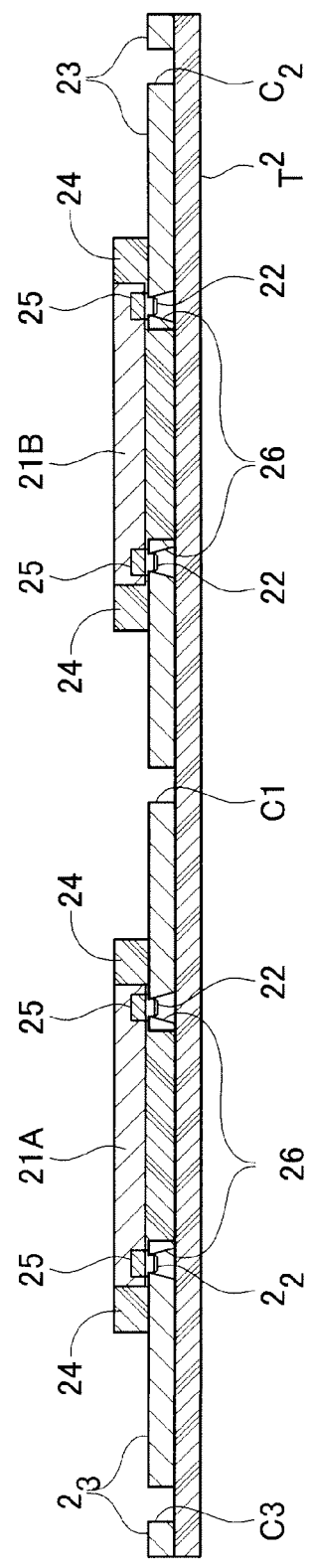
FIG. 10 is an exemplary diagram of a dicing process, in accordance with an embodiment of the invention.

After the trimming process, a dicing process is carried out as shown in FIG. 10. In the dicing process, the lead frame 23 is cut by a dicing blade not shown, at the position of the respective cut sections C1 through C3. As a result, the lead frame 23 is cut at the position of the respective cut sections C1 through C3. The lead frame 23 is thus separated at the position of each of the cut sections C1 through C3.

Figure 11:
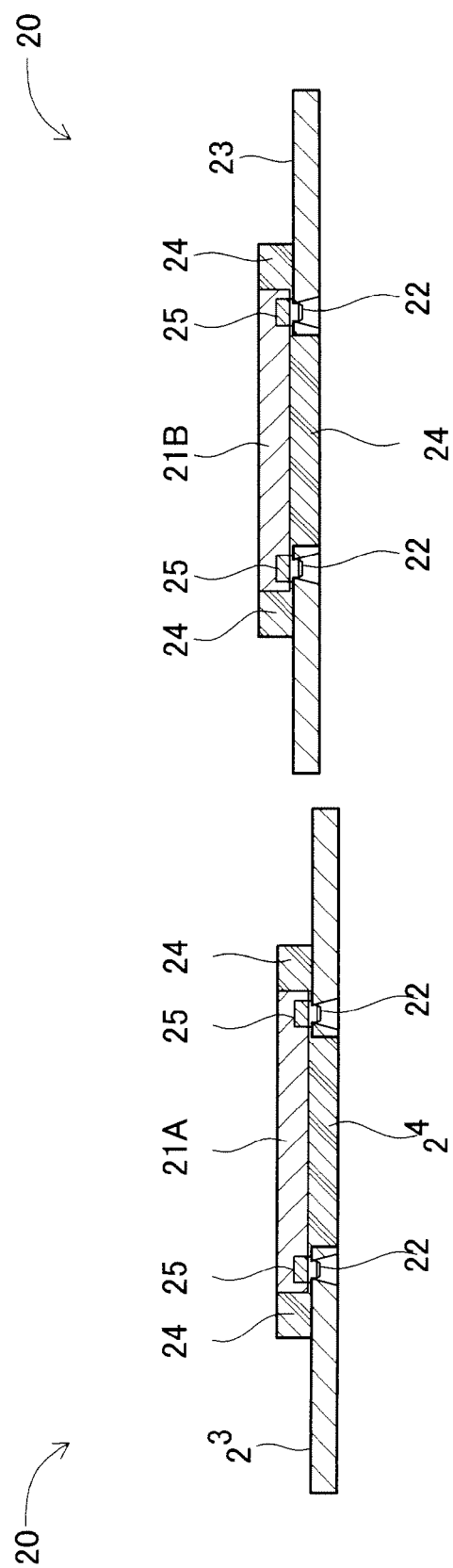
FIG. 11 is an exemplary diagram of a protective tape peeling process, in accordance with an embodiment of the invention.

After the dicing process, a protective tape peeling process is carried out as shown in FIG. 11. In the protective tape peeling process, the protective tape T2 attached to the lead frame 23 (refer to FIG. 10) is removed. As a result, a semiconductor package 20 is formed which is provided with the flip chips 21 (21A and 21B), lead frames 23 fixed to the metal bumps 22 and molding section 24.

Figure 12:
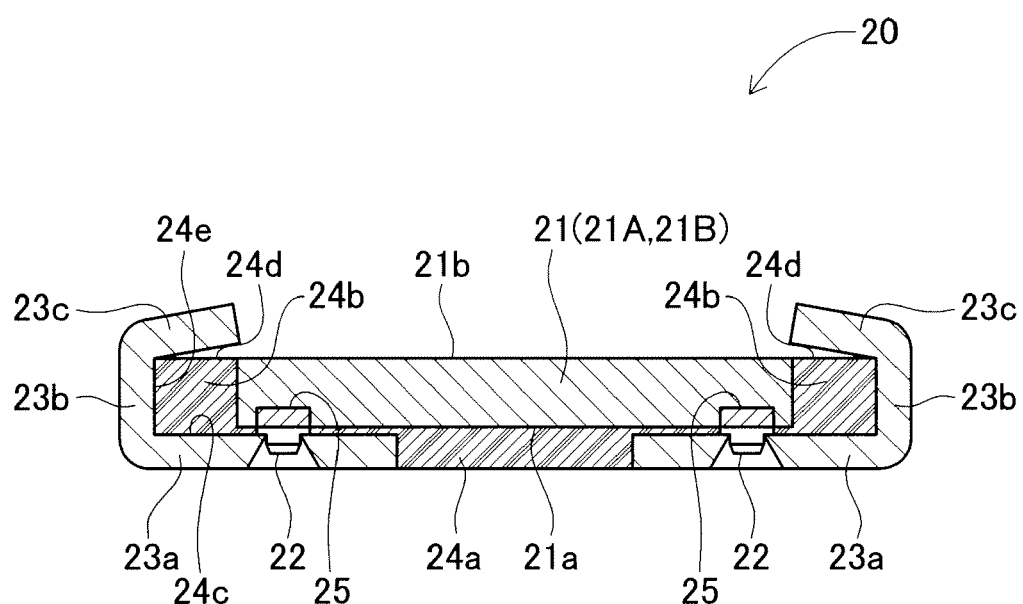
FIG. 12 is an exemplary diagram of a lead frame forming process, in accordance with an embodiment of the invention.

After the protective tape peeling process, a lead frame forming process is carried out as shown in FIG. 12. In the lead frame forming process, the lead frame 23 of the semiconductor package 20 is bent from the bottom surface 24c of the molding section 24b along the side surfaces 24e of the molding section 24b. As a result, a first lead frame 23a and a second lead frame 23b are formed.

Further, the end portions of the lead frame 23 formed along the side surfaces 24e of molding section 24b are bent towards the upper surface 24d of the molding section 24b. As a result, the third lead frame 23c is formed.

In the method of manufacturing the semiconductor package 20, the above-described metal bump welding process may be omitted if the metal bumps 22 can be firmly fitted into through holes 26 in the above-described flip chip mounting process. In the present embodiment, the processes from the lead frame fixing process to the lead frame forming process correspond to the operation of manufacturing semiconductor package of the present invention.

Each of the semiconductor packages 20A through 20C are subjected to an inspection process in which a conductive state of the lead frames is inspected. Thereafter, each of the semiconductor packages 20A through 20C are sequentially housed in the semiconductor package housing case 30. The distance A from the top plate 32 of the semiconductor package housing case 30 to the boundary section of the side plates 33 with the claws 31 (refer to FIG. 13) is determined based on the results of a calculation using the following calculating expression:

$$A=[N\times\{B-(C/2)\}]+D$$

Here,

B is the maximum distance between the first lead frame 23a and the third lead frame 23c;

C is the maximum distance between the third lead frame 23c and the upper surface 21b of the flip chip 21;

D is the thickness of the mother substrate 10; and

N is the number of semiconductor packages (in the present embodiment, N=3).

Figure 13:
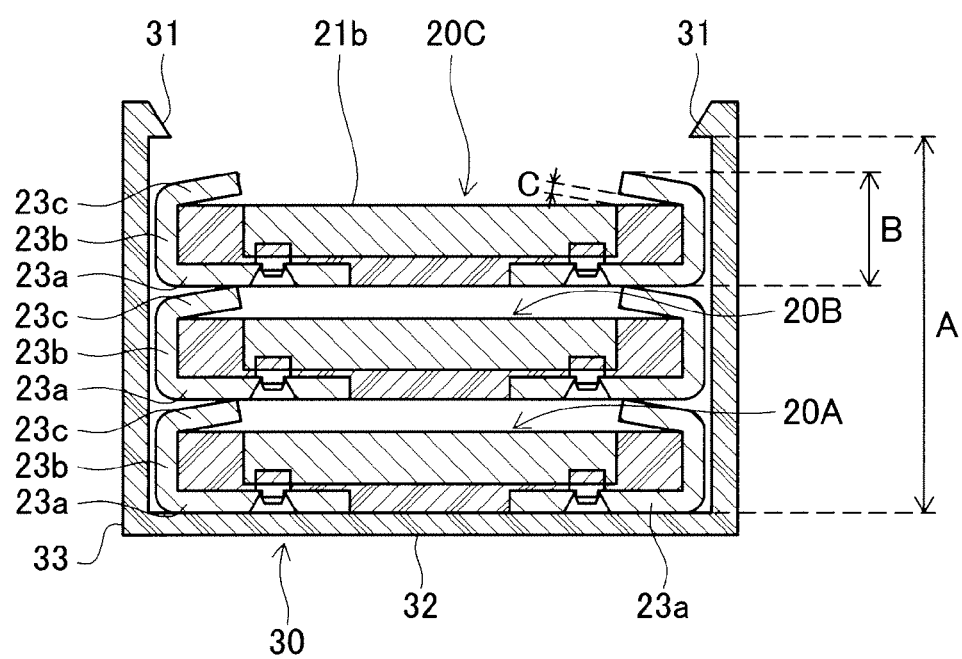
FIG. 13 is an exemplary diagram of a process of housing the semiconductor packages in a semiconductor package housing case, in accordance with an embodiment of the invention.

In the process of manufacturing the semiconductor device 1, the semiconductor package 20 A is housed in the housing case 30 so that the first lead frame 23a abuts against the top plate 32 of the semiconductor package housing case 30, as shown in FIG. 13. At this time, the second lead frame 23b of the semiconductor package 20A abuts against the side plates 33 of the semiconductor package housing case 30.

Next, the semiconductor package 20B and the semiconductor package 20C are sequentially housed in the semiconductor package housing case 30. Here, the first lead frame 23a of the semiconductor package 20B is brought in contact with the third lead frame 23 of the semiconductor package 20A. The second lead frame 23b of the semiconductor package 20B as well abuts against the side plates 33 of the semiconductor package housing case 30. In addition, the first lead frame 23a of the semiconductor package 20C is brought in contact with the third lead frame 23c of the semiconductor package 20B. The second lead frame 23b of the semiconductor package 20C as well abuts against the side plates 33 of the semiconductor package housing case 30.

Figure 14:
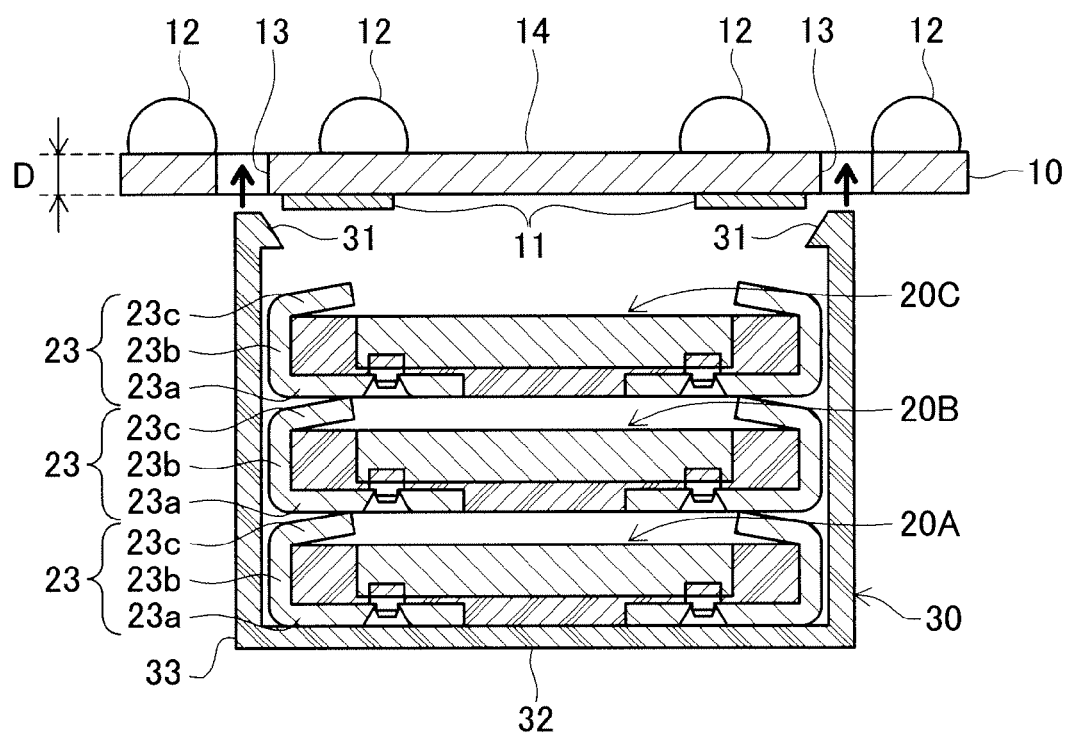
FIG. 14 is an exemplary diagram of a process of engaging a mother substrate with the semiconductor package housing case, in accordance with an embodiment of the invention.

Next, the claws 31 of the semiconductor package housing case 30 are press-fitted into the through holes 13 of the mother substrate 10 for engagement with the lower surface 14 of the mother substrate 10, as shown in FIG. 14. When press-fitting claws 31 into the through holes 13, the first lead frame 23a of the semiconductor package 20A is pressed by the top plate 32 of the semiconductor package housing case 30 towards the mother substrate 10. As a result of the first lead frame 23a of the semiconductor package 20A being pressed towards the mother substrate 10, the third lead frame 23c of each of the semiconductor packages 20A through 20C is pressed towards the mother substrate 10. Each one of the third lead frames 23c is thus deformed by the force applied by the top plate 32. As shown in FIG. 1, the third lead frame 23c of the semiconductor package 20A is pressed against the first lead frame 23a of the semiconductor package 20B, and the third lead frame 23c of the semiconductor package 20B is pressed against the first lead frame 23a of the semiconductor package 20C. In addition, the third lead frame 23c of the semiconductor package 20C is pressed against the wiring patterns 11. The lead frame 23 of each one of semiconductor packages 20A through 20C that abut against each other is made conductive with the wiring patterns 11 of the mother substrate 10.

In the present embodiment, the semiconductor package housing case 30 corresponds to the case of the present invention. The top plate 32 of the semiconductor package housing case 30 corresponds to the pressure-contact section and the depressing section of the present invention. The side plates 33 of the semiconductor package housing case 30 correspond to the pressure-contact section and the positioning section of the present invention.

In the present embodiment, pressing the third lead frame 23c of each one of the semiconductor packages 20A through 20C towards the wiring patterns 11 of the mother substrate 11 by using the top plate 32 of the semiconductor package housing case 30 corresponds to the operation of pressure-contacting of the present invention. Also, pressing the first lead frame 23a of the semiconductor package 20A towards the mother substrate 10 by using the top plate 32 of the semiconductor package housing operation corresponds to the operation of depressing of the present invention. Further, housing the semiconductor package 20C in the semiconductor package housing case 30 and pressing the third lead frame 23c of the semiconductor package 20C against the wiring patterns 11 corresponds to the operation of positioning of the present invention. The operation of manufacturing mother substrate of the present invention is realized by a known method of forming wiring patterns 11 on the mother substrate 10.

According to the semiconductor device 1 and its manufacturing method of the present embodiment, the lowermost semiconductor package 20C among the three semiconductor packages 20A through 20C is depressed towards the mother substrate 10 by using the top plate 32 of the semiconductor package housing case 30 to engage the side plates 33 of the semiconductor package housing case 30 with the mother substrate 10, whereby the lowermost semiconductor package 20C is positioned on the wiring patterns 11. Here, according to the semiconductor device 1 and its manufacturing method of the present embodiment, a plurality of semiconductor packages including the uppermost semiconductor package 20A to the lowermost semiconductor package 20C can be in pressure-contact with each other by a depressing force applied by the top plate 32 to the uppermost semiconductor package 20A. Thus, the stacking of the three semiconductor packages 20A through 20C does not require the use of solder. Further, since the side plates 33 engaged with the mother substrates 10 position the lowermost semiconductor package 20C upon the wiring patterns 11, the side plates 33 that have become integral with the top plate 32 retain the depressing force applied by the top plate 32, and as a result, positioning of the lowermost semiconductor package 20C onto the wiring patterns 11 does not require the use of solder. Accordingly, according to the semiconductor device 1 and its manufacturing method of the present embodiment, since stacking of the three semiconductor packages 20A through 20C and positioning of the lowermost semiconductor package 20e onto the wiring patterns 11 do not require the use of solder, warpage caused by an increase in temperature at the time of heating the solder is unlikely to occur in the flip chip 21 provided in each of the semiconductor packages 20A through 20C. Thus, in the process of manufacturing the first semiconductor device 1, stacking of the semiconductor packages 20A through 20C is not hindered by the warpage in the flip chip 21, thereby allowing the three semiconductor chips 20A through 20C to be easily stacked.

According to the semiconductor device 1 and its manufacturing method of the present embodiment, a depressing force is applied to the uppermost semiconductor package 20A by the top plate 32 of the semiconductor package housing case 30, in a state that the first lead frame 23a of the semiconductor package 20B is brought in contact with the third lead frame 23c of the semiconductor package 20A, and the first lead frame 23a of the semiconductor package 20C is brought in contact with the third lead frame 23c of the semiconductor package 20B. Thereafter, each of the third lead frames 23c is deformed under the above-mentioned depressing force, so that the third lead frame 23c of the semiconductor package 20A is pressed against the first lead frame 23a of the semiconductor package 20B, and the third lead frame 23c of the semiconductor package 20B is pressed against the first lead frame 23a of the semiconductor package 20C. Here, according to the semiconductor device 1 and its manufacturing method of the present embodiment, when a state is maintained in which the lead frames 23 of the respective semiconductor packages 20A through 20C abut against each other under the depressing force applied to the uppermost semiconductor package 20A, a conductive state between the lead frames 23 can be established without using solder. Accordingly, according to the semiconductor device 1 and its manufacturing method of the present embodiment, since a conductive state of the lead frames 23 of the semiconductor packages 20A through 20C can be established, the use of solder becomes unnecessary, which makes it possible to prevent warpage caused by an increase in temperature at the time the solder is heated from occurring in the flip chip 21 provided in each of the semiconductor packages 20A through 20C.

Also, according to the semiconductor device 1 and its manufacturing method of the present embodiment, the third lead frame 23c of the lowermost semiconductor package 20C is pressed against the wiring patterns 11 with the lead frames of each of the semiconductor packages 20A through 20C being maintained in an abutting state and the second lead frame 23b of each of the semiconductor packages 20A through 20C abutting against the side plates 33. Here, according to the semiconductor device 1 and its manufacturing method of the present embodiment, movement of the semiconductor packages 20A through 20C can be prevented by using the configuration in which the second lead frame 23b of each of the semiconductor packages 20A through 20C abuts against the side plates 33, whereby the stacked state of the three semiconductor packages 20A through 20C can be maintained.

According to the semiconductor device 1 and its manufacturing method of the present embodiment, when claws 31 of the semiconductor package housing case 30 are engaged with the lower surface 14 of the mother substrate 10, the claws 31 can be pressed against the lower surface 14 of the mother substrate 10, whereby the side plates 33 of the semiconductor package housing case 30 are fixed in the mother substrate 10. According to the semiconductor device 1 and its manufacturing method of the present embodiment, when the side plates 33 are fixed in the mother substrate 10, the second lead frames 23b of each of the semiconductor packages 20A through 20C can be made to firmly abut against the side plates 33, whereby a state in which three semiconductor packages 20A through 20C are stacked can be continuously maintained.

According to the semiconductor device 1 and its manufacturing method of the present embodiment, when flip chip 21 is provided with metal bumps 22 that are connected with electrodes 25, and the first lead frame 23a is provided with through holes 26 in which the metal bumps 22 are fitted, electrodes 25 can be connected to the first lead frame 23a by fitting the metal bumps 22 into the through holes 26. Here, according to the semiconductor device 1 and its manufacturing method of the present embodiment, since establishment of a connection of the electrodes 25 with the first lead frame 23a does not require passing through lead wires and the molding section that seals these lead wires, the thickness of the molding section is not added to the thickness of each of the semiconductor packages 20A through 20C. Accordingly, according to the semiconductor device 1 and its manufacturing method of the present embodiment, it is possible to prevent an increase in the thickness of each of the semiconductor packages 20A through 20C.

According to the semiconductor device 1 and its manufacturing method of the present embodiment, when the fitting section between the metal bumps 22 and the through holes 26 of the first lead frame 23a is laser-welded, it is possible to join the metal bumps 22 with the through holes 26 while suppressing welding deformation of the fitting portion, whereby the connection state between the metal bumps 22 and the first lead frame 23a can be reinforced.

According to the first semiconductor device 1 of the present embodiment, when distance A of from the top plate 32 to a border section between the side plates 33 and the claws 31 (refer to FIG. 13) is determined by the result of the calculation using the above-mentioned calculating expression, distance A is determined by highlighting the computational element (C/2), so that if the three semiconductor packages 20A through 20C are housed in the semiconductor package housing case 30, it is possible to prevent the third lead frames 23c of each of the semiconductor packages 20A through 20C from being excessively pressed onto the upper surface 21b of the flip chip 21. According to the semiconductor device 1 of the present embodiment, it is possible to prevent the third lead frames 23c of the upper semiconductor packages and the first lead frames 23a of the lower semiconductor packages from being excessively pressure-contact, whereby lead frames 23 of each of the semiconductor packages 20A through 20C can be pressure-contact while preventing the lead frames of each of the semiconductor packages 20A through 20C from being damaged.

Figure 15:
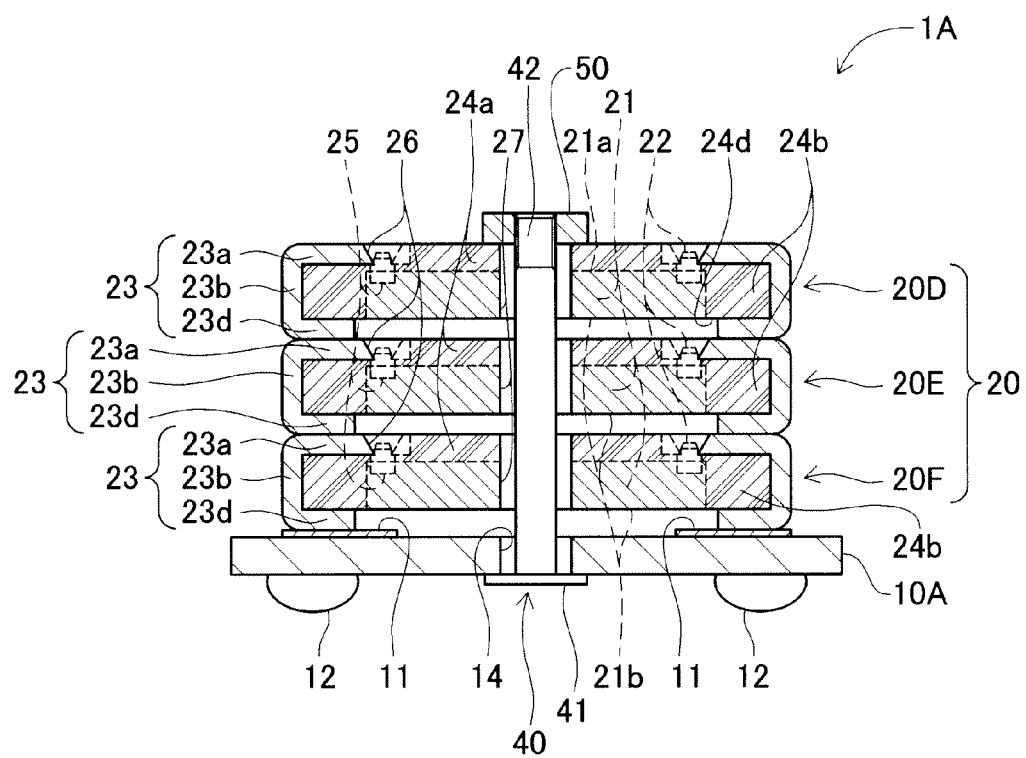
FIG. 15 is a schematic cross-sectional diagram showing a semiconductor device in accordance with another embodiment of the invention.

A second embodiment of the present invention will be described while referring to FIG. 15. FIG. 15 is a schematic cross-sectional diagram showing a semiconductor device 1A of the second embodiment 2 of the present invention. Here, elements which are identical to those of the first embodiment are denoted by the same numerical symbols, and therefore further description thereof is hereby omitted. The semiconductor device 1A is provided with a mother substrate (or substrate) 10A, a semiconductor package 20, a screw bolt 40 and pressing bolt 50.

The mother substrate 10A is provided with a through hole 14. In the present embodiment, one through hole 14 is provided in the mother substrate 10A.

Each of the semiconductor packages 20D through 20F are provided with a lead frame 23 and a notch hole 27. The lead frame 23 comprises a first lead frame 23a, a second lead frame 23b and a fourth lead frame 23d. The fourth lead frame 23d is formed along an upper surface 24d of the molding section 24b.

The fourth lead frame 23d of the semiconductor package 20D is mounted on the first lead frame 23a of the semiconductor package 20E. The fourth lead frame 23d of the semiconductor package 20E is mounted on the first lead frame 23a of the semiconductor package 20F. The fourth lead frame 23d of the semiconductor package 20F is mounted on wiring patterns 11 of the mother substrate 10A.

Notch hole 27 is formed in a semicircle shape. The screw bolt 40 is provided with a head section 41 and a screw tap section 42. The diameter of the head section 41 is set to a larger value than the external diameter of the screw bolt 40 and the external diameter of the through hole 14. The screw tap section 42 is formed at the periphery of the screw bolt 40 over a predetermined length from a leading end of the screw bolt 40 towards the head section 41.

The screw bolt 40 is passed through the through hole 14 of the mother substrate 10A and the notch hole 27 in each of the semiconductor packages 20D through 20F. The head section 41 is locked in a lower surface of the mother substrate 10A. One part of the screw tap section 42 is arranged to protrude from the uppermost semiconductor package 20D from amongst the semiconductor packages 20D through 20F in a stacked state.

The pressing bolt 50 is screw-fitted into the screw tap section 42 to be fastened in the screw bolt 40. The pressing bolt 50 fastened in the screw bolt 40 presses against the uppermost semiconductor package 20D from amongst the semiconductor packages in a stacked state, thereby fixing the semiconductor packages 20D through 20F in a stacked state on the mother substrate 10A.

Next, the manufacturing method of the semiconductor device 1A will be described. In the present embodiment, the first lead frames 23a and the second lead frames 23b are formed in a similar fashion with the lead frame forming process of the first embodiment as described above. Further, in the present embodiment, an end portion of the lead frame 23 formed along the side surfaces of the molding section 24b is bent towards the upper surface 24d of the molding section 24b, in the lead frame forming process. As a result, the fourth lead frame 23d is formed.

Figure 16:
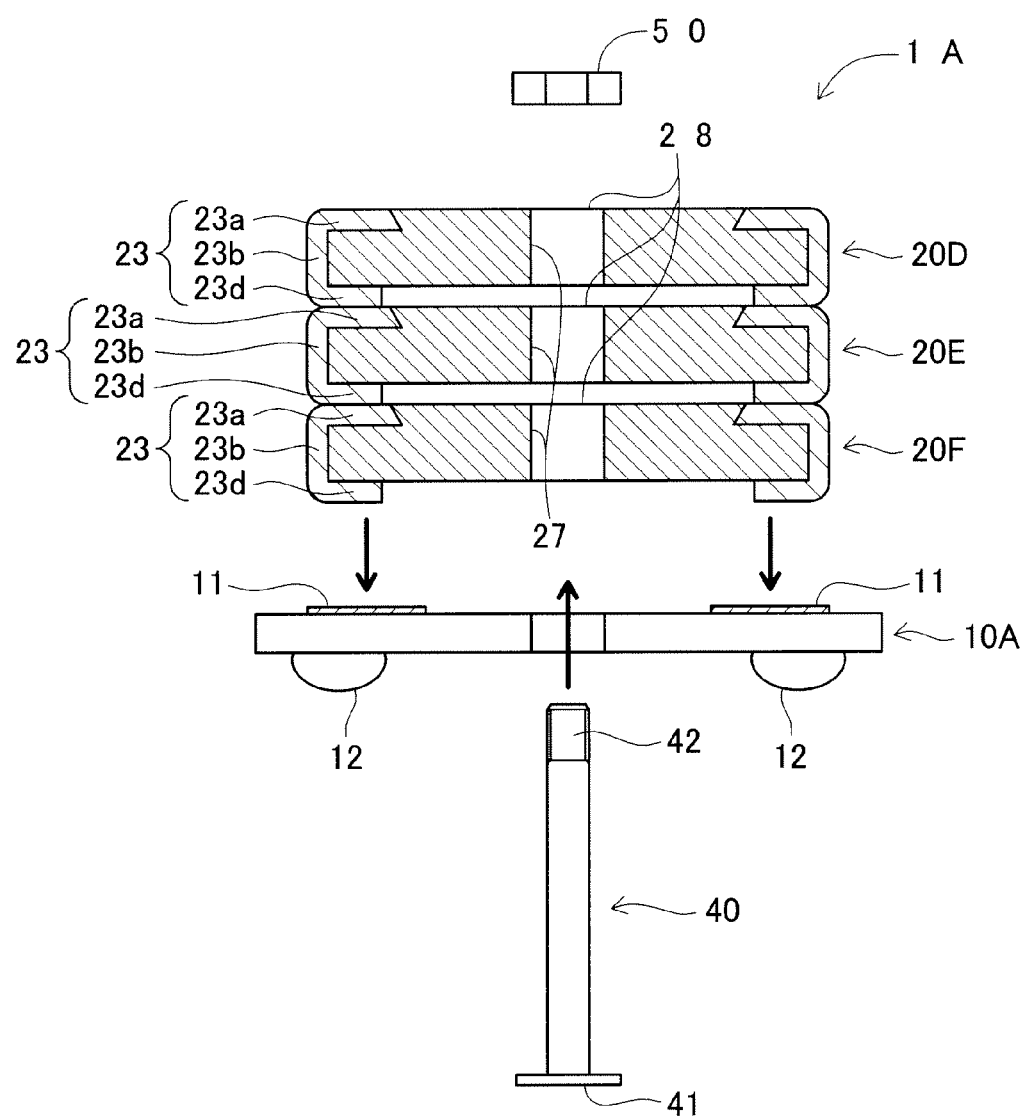
FIG. 16 is an exemplary diagram of a process of fixing semiconductor packages in a mother substrate, in accordance with an embodiment of the invention.

Similarly with each of the semiconductor packages 20A through 20C of the first embodiment, each of the semiconductor packages 20D through 20F are subjected to conduction inspection. Thereafter, the fourth lead frame 23d of the semiconductor package 20E is mounted on the first lead frame 23a of the semiconductor package 20F, as shown in FIG. 16. At this time, an opening section 28 of the notch section 27 in the semiconductor package 20E is arranged at an upper side of the opening section 28 of the notch hole 27 in the semiconductor package 20F.

Next, the fourth lead frame 23d of the semiconductor package 20D is mounted on the first lead frame 23a of the semiconductor package 20E. At this time, the opening section 28 of the notch section 27 in the semiconductor package 20D is arranged at an upper side of the opening section 28 of the notch hole 27 in the semiconductor package 20E. As a result, after the semiconductor package 20F is arranged III the lowermost layer, the semiconductor package 20E is arranged in an intermediate layer, and the semiconductor package 20D is arranged in the uppermost layer, whereby the three semiconductor packages 20D through 20F are stacked.

Figure 17:
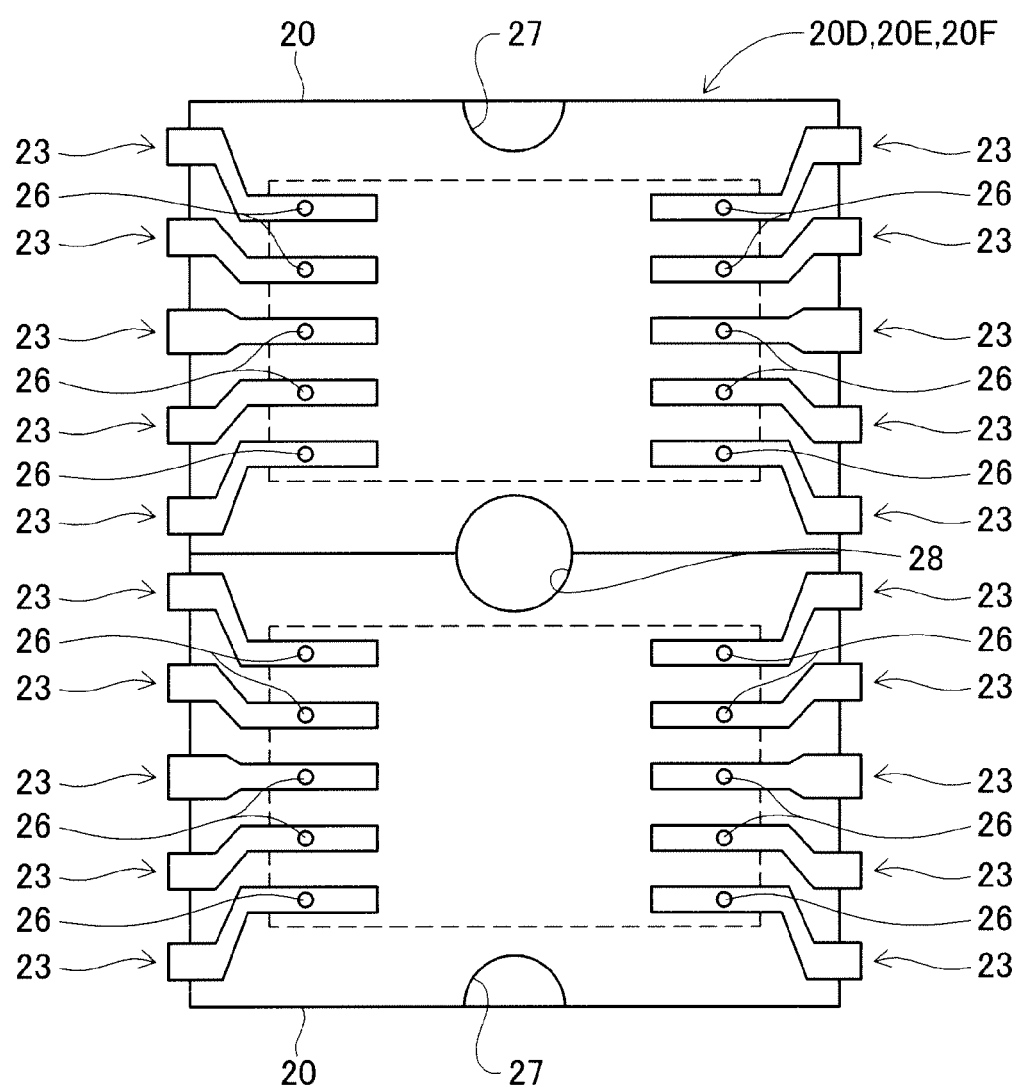
FIG. 17 is a diagram showing a planar configuration of the semiconductor packages in the semiconductor device, in accordance with an embodiment of the invention.

As shown in FIG. 17, the semiconductor packages 20D through 20F in the respective layers are respectively formed in two respective pairs of semiconductor packages. When two semiconductor packages are combined, two notch sections 27 are combined to form a circular opening section 28.

Thereafter, the fourth lead frame 23d of the lowermost semiconductor package 20F is mounted on the wiring patterns 11 of the mother substrate 10A, as shown in FIG. 16. Then, the screw bolt 40 is inserted from the lower surface of the mother substrate 10A into the through hole 14. The screw bolt 40 is inserted from the through hole 14 towards the opening section 28 of each of the semiconductor packages 20F through 20D until the head section 41 thereof is locked into the lower surface of the mother substrate 10A.

Then, the pressing bolt 50 is screw-fitted in the screw tap section 42 of the screw bolt 40. Subsequently, the pressing bolt 50 is rotated to temporarily lock the pressing bolt 50 in the screw bolt 40. The fastening force of the pressing bolt 50 is then adjusted to fully tighten the pressing bolt 50 and thus fix it in the semiconductor package 20D. The fourth lead frame 23d of the uppermost semiconductor package 20D depresses the first lead frame 23a of the intermediate semiconductor package 20E by using the pressing bolt 50 fixed in the semiconductor package 20D, and the fourth lead frame 23d of the intermediate semiconductor package 20E depresses the first lead frame 23a of the lowermost semiconductor package 20F.

Further, the fourth lead frame 23d of the intermediate semiconductor package 20E depresses the fourth lead frame 23d of the lowermost semiconductor package 20F towards the mother substrate 10A by using the pressing bolt 50 fixed in the semiconductor package 20D. Here, the fourth lead frame 23d of the semiconductor package 20F is brought into pressure-contact with the wiring patterns 11. Therefore, the lead frames 23 of the respective semiconductor packages 20D through 20F that are in pressure-contact with each other by the pressing bolt 50 are made conductive with the wiring patterns 11.

In the present embodiment, the screw bolt 40 corresponds to a communication rod of the present invention. The pressing bolt 50 corresponds to an adjust bolt of the present invention. Also, in the present embodiment, passing the screw bolt 40 from the through hole 14 towards the opening section 28 of each of the semiconductor packages 20F through 20D until the head section 41 is locked in the lower surface of the mother substrate 10A corresponds to the operation of positioning of the present invention. Further, depressing the semiconductor package 20D towards the mother substrate 10A by the pressing bolt 50 by adjusting the fastening force of the pressing bolt 50 corresponds to the operation of depressing of the present invention.

According to the semiconductor device 1A and its manufacturing method of the present invention, the head section 41 of the screw bolt 40 is locked in the lower surface of the mother substrate 10A, and the screw bolt 40 is made communicative with the opening section 28 in each of the semiconductor packages 20F through 20D, whereby the uppermost semiconductor package 20D from amongst the semiconductor packages in a stacked state is pressed by the pressing bolt 50 fastened in the screw tap section 42 of the screw bolt 40. Here, the depressing force that is transmitted from the uppermost semiconductor package 20D to the intermediate semiconductor package 20E and the lowermost semiconductor package 20F can be adjusted by adjusting the fastening force of the pressing bolt 50. Therefore, according to the semiconductor device 1A and its manufacturing method of the present embodiment, the abutting state of the lead frames 23 of the respective semiconductor packages 20D through 20F can be optimally adjusted by adjusting the depressing force, and the fourth lead frame 23d of the lowermost semiconductor package 20F can be optimally brought into pressure-contact with the wiring patterns 11.

Figure 18:
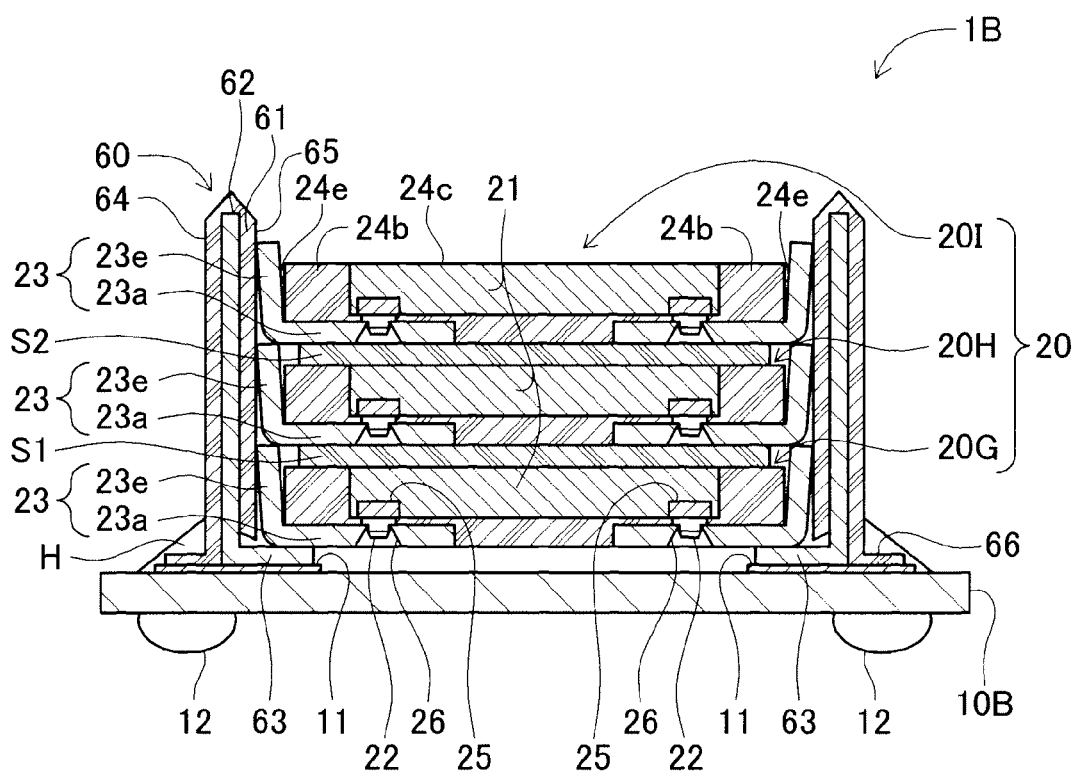
FIG. 18 is a schematic cross-sectional diagram of a semiconductor device in accordance with yet another embodiment of the invention.

A third embodiment of the present invention will be described while referring to FIG. 18. FIG. 18 is a schematic cross-sectional diagram showing a semiconductor device 1B of the third embodiment of the present invention. Here, elements which are identical with those of the first embodiment and the second embodiment are denoted by the same numerical symbols, and further description thereof is hereby omitted. The semiconductor device 1B is provided with a mother substrate (or substrate) 10B, a semiconductor package 20 and semiconductor package support members 60.

Each of the semiconductor packages 20G through 20I are provided with a lead frame 23, respectively. The lead frame 23 is provided with a first lead frame 23a and a fifth lead frame 23e. The fifth lead frame 23e is extended from the first lead frame 23a and is bent towards the side surface 24e of the molding section 24b.

The semiconductor package 20H is mounted on the semiconductor package 20G through a spacer S1. A leading edge of the fifth lead frame 23e in the semiconductor package 20G abuts against a side edge of the first lead frame 23a in the semiconductor package 20H.

The semiconductor package 20I is mounted on the semiconductor package 20H through a spacer S2. The leading end of the fifth lead frame 23e in the semiconductor package 20H abuts against the side edge of the first lead frame 23a in the semiconductor package 20I. Spacers S1 and S2 are formed of epoxy resin.

The semiconductor package support member 60 is provided with an insulating resin layer 61 and a conductive layer 62. The conductive layer 62 is provided with a connection terminal 63. A lateral surface 64 of an insulating resin layer 61 is fixed onto the upper surface of the mother substrate 10B and a wiring pattern 11 by solder H. The conductive layer 62 is erected on the mother substrate 10B towards the stacking direction of the semiconductor packages 20G through 20I. The connection terminals 63 are conductively connected to the wiring patterns 11 of the mother substrate 10B.

The first lead frame 23a of the semiconductor package 20G abuts against the connection terminals 63. The fifth lead frame 23e of the semiconductor package 20G is pressed against an inner surface 65 of the insulating resin layer 61 by the elastic force of the fifth lead frame 23e. The fifth lead frame 23e in the respective semiconductor packages 20H and 20I is pressed against an inner surface 65 of the insulating resin layer 61, in a similar fashion with the semiconductor package 20G.

Figure 19:
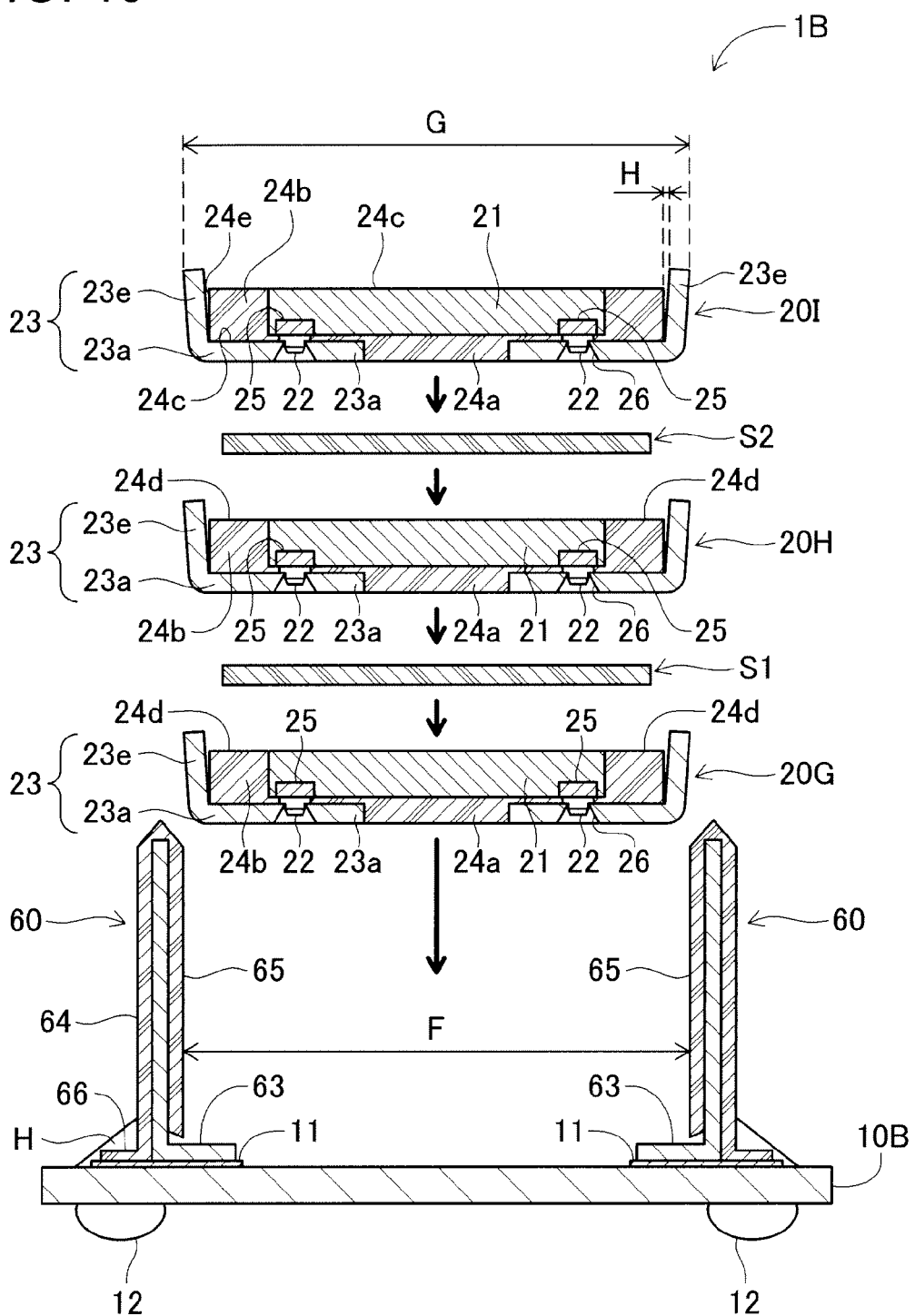
FIG. 19 is an exemplary diagram of a manufacturing method of the semiconductor device in accordance with an embodiment of the invention.

Next, the manufacturing method of the semiconductor device 1B is described using FIG. 19. In the present embodiment, the lead frame forming process is carried out in a similar fashion with the first embodiment and the second embodiment. In the lead frame forming process of the present embodiment, lead frame 23 formed along the bottom surface 24c of the molding section 24b is bent towards the side surface 24e of the molding section 24b. As a result, the first lead frame 23a and the fifth lead frame 23e are formed.

In the manufacturing method of the semiconductor device 1B, the insulating resin layer 61 is first mounted on the conductive layer 62 with the connection terminals 63 being exposed, thereby forming the semiconductor package support member 60. Then, the fix terminals 66 of the insulating resin layer 61 and the connection terminals 63 of the conductive layer 62 are mounted on the wiring pattern 11, to thereby temporarily place the semiconductor package support member 60 on the mother substrate 10B.

The distance F at which inner surfaces 65 of two semiconductor package support members 60 face each other is determined based on the result of the calculation using the following calculating expression.

$$F = G - H$$

Here,

G is the maximum distance between the fifth lead frames 23e at both sides of the semiconductor packages; and H is the maximum distance between the fifth lead frame 23e and the side surface 24e of the mold section 24b.

Next, the fix terminals 66 of the semiconductor package support members 60 are covered by solder H, in a state that the connection terminals 63 are mounted on the wiring patterns 11 to temporarily place the semiconductor package support members 60 on the mother substrate 10B. As a result, the solder H fixes the fix terminals 66 onto the upper surface of the mother substrate 10B and the connection terminals 63 abut against the wiring patterns 11.

Then, the first lead frame 23a of the semiconductor package 20G is brought close to the connection terminals 63, while the fifth lead frame 23e of the semiconductor package 20G is arranged along the inner surfaces 65 of the semiconductor package support members 60, against the resistance of the elastic force of the fifth lead frame 23e, as shown in FIG. 19. Thereafter, the first lead frame 23a of the semiconductor package 20G is made to abut against the connection terminals 63.

Next, spacer S1 is mounted on the upper surface 24d of the molding section 24b and the upper surface of the flip chip 21 provided in the semiconductor package 20G. Then, similarly with the semiconductor package 20G, the semiconductor package 20H is brought close to the spacer S1 while the fifth lead frame 23e of the semiconductor package 20H is arranged along the inner surfaces 65 of the semiconductor package support members 60. Here, the thickness of the spacer S1 is adjusted accordingly, and the upper surface of the spacer S1 is set to the same height as the leading edge of the fifth lead frame 23e in the semiconductor package 20G. Here, when the first lead frame 23a of the semiconductor package 20H is made to abut against the spacer S1, the fifth lead frame 23e of the semiconductor package 20G abuts against the side edges of the first lead frame 23a in the semiconductor package 20H.

Further, the spacer S2 is mounted on an upper surface 24d of the molding section 24b and the upper surface of the flip chip 21 provided in the semiconductor package 20H. Then, similarly with the semiconductor package 20G and the semiconductor package 20H, the semiconductor package 20I is brought close to the spacer S2 while the fifth lead frame 23e of the semiconductor package 20I is arranged along the inner surfaces 65 of the semiconductor package support members 60. When the first lead frame 23a of the semiconductor package 20I is made to abut against the spacer S2, the fifth lead frame 23e of the semiconductor package 20H abuts against the side edges of the first lead frame 23a of the semiconductor package 20I.

In the semiconductor device 1B of the present embodiment, the uppermost semiconductor package 20I is stacked on the intermediate semiconductor package 20H in a state that the side edges of the first lead frame 23a in the uppermost semiconductor package 20I abut against the leading edges of the fifth lead frame 23e in the intermediate semiconductor package 20H.

In addition, the intermediate semiconductor package 20H is stacked on the lowermost semiconductor package 20G in a state that the side edge of the first lead frame 23a in the intermediate semiconductor package 20H abuts against the leading edge of the fifth lead frame 23e in the lowermost semiconductor package 20G.

Further, the first lead frame 23a of the lowermost semiconductor package 20G is brought into pressure-contact with the connection terminals 63 by the semiconductor packages 20H and 20I stacked on the upper side of the above-mentioned semiconductor package 20G. The lead frames 23 in the respective semiconductor packages 20G through 20I which abut against each other are made conductive with the wiring patterns 11 through the connection terminals 63.

In the semiconductor device 1B of the present embodiment, the fifth lead frame 23e is pressed against the inner surfaces 65 of the semiconductor package support members 60 under the elastic force of the fifth lead frames 23e in the respective semiconductor packages 20G through 20I, so that the respective semiconductor packages 20G through 20I are held in the inner surface 65.

In the present embodiment, the connection terminal 63 corresponds to the pressure-contact terminal of the present invention. The conductive layer 62 and the connection terminal 63 correspond to the conductive connection section of the present invention. The insulating resin layer 61 corresponds to the fixing member (first holding section) of the present invention.

In the present embodiment, bringing the first lead frame 23a of the lowermost semiconductor package 20G into pressure-contact with the connection terminals 63 corresponds to the operation of abutting of the present invention. Holding the respective semiconductor packages 20G through 20I in the inner surfaces 65 under the elastic force of the fifth lead frames 23e in the respective semiconductor packages 20G through 20I corresponds to the operation of first holding of the present invention.

In the semiconductor device 1B and its manufacturing method according to the present embodiment, the first lead frame 23a of the lowermost semiconductor package 20G is brought into pressure-contact with the connection terminals 63 that abut against the wiring patterns 11. In addition, the respective semiconductor packages 20G through 20I press the fifth lead frames 23e of the respective packages 20G through 20I against the inner surfaces 65 of the insulating resin layer 61 under the elastic force of the fifth lead frames 23e in a state that the first lead frames 23a and the fifth lead frames 23e are made to abut against each other, thereby holding the respective semiconductor packages 20G through 20I in the inner surfaces 65 of the insulating resin layer 61. Here, since stacking and holding the three semiconductor packages 20G through 20I does not require the use of solder, the state in which the respective semiconductor packages 20G through 20I are held in the inner surfaces 65 can be released by releasing the elastic force of the fifth lead frame 23e, thereby making it possible to easily release the stacked state of the three semiconductor packages 20G through 20I. Thus, after the stacked state of the three semiconductor packages 20G through 20I is released, the respective semiconductor packages 20G through 20I can be separated, thereby making it possible to reuse the separated semiconductor packages.

According to the semiconductor device 1B of the present embodiment, when the distance F at which the inner surfaces 65 in two semiconductor package support members 60 face each other (refer to FIG. 19) is determined by the results of the calculation using the above-described calculating expression, the distance F is determined by highlighting the computational element (G), thereby making it possible to prevent the fifth lead frame 23e in the respective semiconductor packages 20G through 20I from being brought excessively close to the side surface 24e of the mold section 24b. According to the semiconductor device 1B of the present embodiment, the elastic force of the fifth lead frame 23e of the respective semiconductor packages 20G through 20I does not work excessively on the inner surfaces 65 of the semiconductor package support members 60, which thus makes it possible to prevent the fifth lead frames 23e from being damaged.

Figure 20:
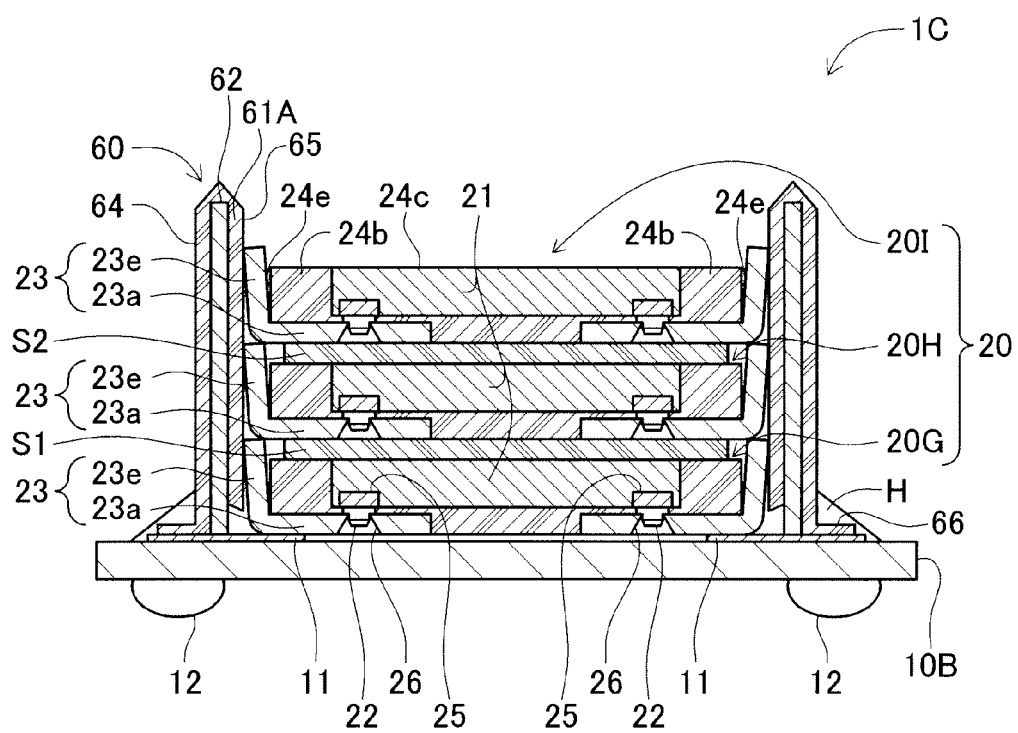
FIG. 20 is a schematic cross-sectional diagram of a semiconductor device in accordance with still another embodiment of the invention.

The present invention is not limited to the above-described embodiments and various changes and modifications can be made to the disclosed embodiments without departing from the spirit and scope of the invention. Unlike the above-described third embodiment, in the semiconductor device 1C shown in FIG. 20, connection terminals 63 are not provided in the conductive layer 62, so that the first lead frame 23a in the lowermost semiconductor package 20G may be brought into pressure-contact with the wiring patterns 11 by the semiconductor packages 20H and 20I stacked on an upper side of the above-described semiconductor package 20G. The insulating resin layer 61A corresponds to the second holding section of the present invention. Also, holding the respective semiconductor packages 20G through 20I in the inner surfaces 65 by the elastic force of the fifth lead frame 23e in the respective semiconductor packages 20G through 20I corresponds to the operation of second holding of the present invention.

Also, similarly with the semiconductor device 1B of the third embodiment, in the semiconductor device 1C, after the stacked state of the three semiconductor packages 20G through 20I is released, the respective semiconductor packages 20G through 20I can be separated, thereby making it possible to reuse the separated semiconductor packages.

Figure 21:
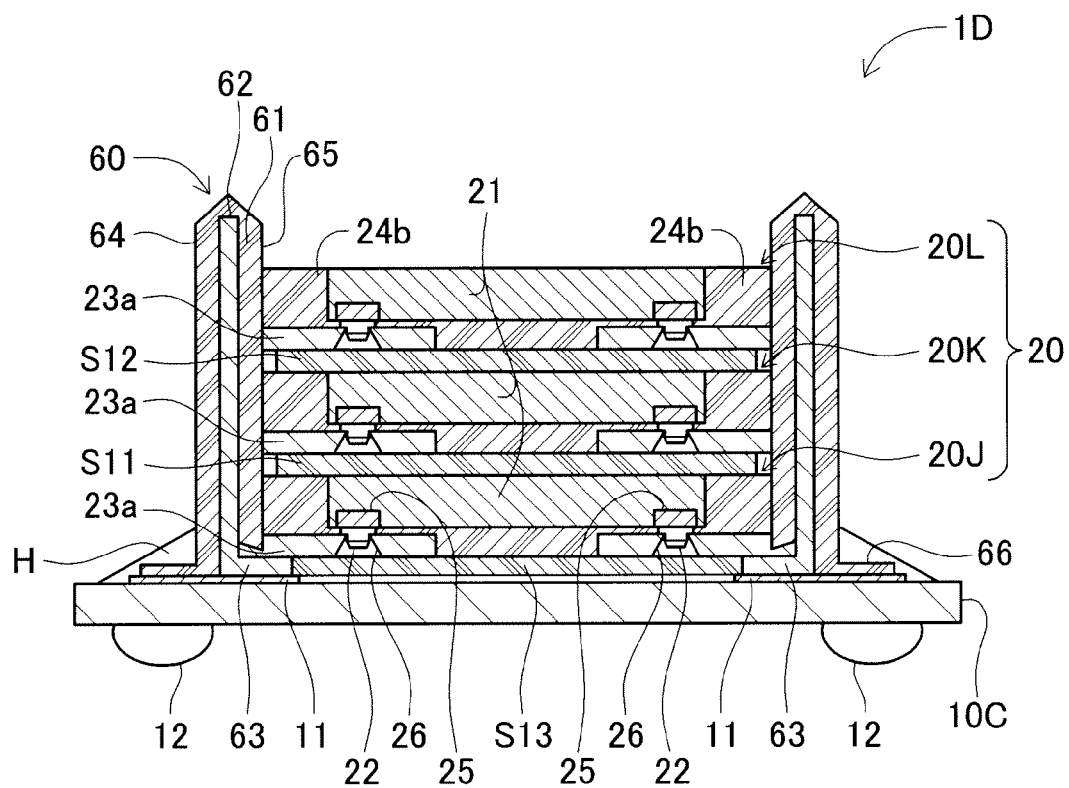
FIG. 21 is a schematic cross-sectional diagram of a semiconductor device in accordance with another embodiment of the invention.

Further, in the semiconductor device 1D shown in FIG. 21, the first lead frame 23a of the lowermost semiconductor package 20J may be brought into pressure-contact with the connection terminals 63, in a state that only the first lead frame 23a is formed in the respective semiconductor packages 20J through 20L and the three semiconductor packages 20J through 20L are stacked with the spacers S11 and S12 provided in-between. In the semiconductor device 1D, spacer S13 is arranged between the upper surface of the mother substrate (or substrate) 10C and the lowermost semiconductor package 20J.

Unlike the above-described embodiment 1 through embodiment 3, in the semiconductor device 1D, lead frames need not be formed in the side surface direction and upper surface direction of the molding section 24b in the respective semiconductor packages 20J through 20L. Thus, in the manufacturing method of the semiconductor device 1D, the number of locations at which lead frames are formed in the respective semiconductor packages 20J through 20L can be reduced, which makes it possible to shorten the lead frame forming process in the respective semiconductor packages 20J through 20L, as compared to the first embodiment through the third embodiment.

In addition, since lead frames need not be formed in the side surface direction of the molding section 24b in the semiconductor device 1D, the width of the respective semiconductor packages 20J through 20L can be reduced. Here, the size of the mother substrate 10C onto which the three semiconductor packages 20J through 20L are stacked can be reduced, thereby making it possible to reduce the planar surface size of the semiconductor device ID, as compared to the semiconductor devices of the first embodiment through the third embodiment.

The foregoing descriptions of various specific embodiments in accordance with the invention have been presented for purposes of illustration and description. They are not intended to be exhaustive or to limit the invention to the precise forms disclosed, and many modifications and variations are possible in light of the above teaching. The invention can be construed according to the Claims and their equivalents.

What is claimed is:

1. A semiconductor device comprising:
   a substrate onto which a wiring pattern is formed;
   a plurality of semiconductor packages wherein each semiconductor package comprises a lead frame that is connected to an electrode of a semiconductor chip and the lead frame is located on a side surface and a bottom surface of the semiconductor package; and
   a pressure-contact section for receiving the plurality of semiconductor packages and for causing the plurality of semiconductor packages to come into contact with the wiring pattern.

2. The semiconductor device of claim 1, wherein the pressure-contact section comprises:
   a depressing section that depresses an uppermost semiconductor package of the plurality of semiconductor packages towards the substrate; and
   a positioning section that engages with the substrate to position a lowermost semiconductor package onto the wiring pattern.

3. The semiconductor device of claim 1, wherein the pressure-contact section comprises:
   a conductive section that is coupled with the wiring pattern; and
   a first holding section for each lead frame of the plurality of semiconductor packages.

4. The semiconductor device of claim 2, wherein each lead frame of the plurality of semiconductor packages comprises a part that extends from the side surface towards an upper surface of each semiconductor package; and
   wherein the semiconductor device further comprises a case that is formed by integrating the depressing section and the positioning section.

5. The semiconductor device of claim 4, wherein the plurality of semiconductor packages are stacked in a manner that each lead frame located on the bottom is arranged upward and the part of each lead frame that extends toward the upper surface of each semiconductor package is arranged downward.

6. The semiconductor device of claim 5, wherein the case comprises a side plate that comprises a fastener for engaging a lower surface of the substrate.

7. The semiconductor device of claim 2, wherein:
   each lead frame of the plurality of semiconductor packages is also located on a top surface of each semiconductor package;
   the positioning section comprises a bolt coupled to a lower surface of the substrate; and
   the depressing section comprises an adjustable nut that couples to the bolt and adjusts a force to the uppermost semiconductor package.

8. The semiconductor device of claim 1, wherein each lead frame of the plurality of semiconductor packages comprises a part that extends from the bottom surface towards the side surface of each semiconductor package, the part for moving toward the side surface.

9. A method for manufacturing a semiconductor device, comprising:
   manufacturing a substrate onto which a wiring pattern is formed;
   manufacturing a plurality of semiconductor packages wherein each semiconductor package comprises a lead frame that is connected to an electrode of a semiconductor chip and the lead frame is located on a side surface and a bottom surface of the semiconductor package;
   causing the plurality of semiconductor packages to come into contact with the wiring pattern via a pressure-contact section of said semiconductor device.

10. The method of claim 9, wherein the causing comprises:
    depressing an uppermost semiconductor package of the plurality of semiconductor packages towards the substrate such that a lowermost semiconductor package comes into contact with the wiring pattern.

11. The method of claim 9, wherein the causing comprises: abutting each lead frame of each semiconductor package against a conductor coupled to the wiring pattern.

12. The method of claim 9, wherein the plurality of semiconductor packages are stacked in a manner that each lead frame located on the bottom is arranged upward and the part of each lead frame that extends toward the upper surface of each semiconductor package is arranged downward.

13. The method of claim 12, wherein the semiconductor device further comprises a case that comprises a fastener.

14. The method of claim 13, further comprising:
engaging the case to a low surface of the substrate via the fastener.

15. The method of claim 9, wherein the pressure-contact section comprises:
a depressing section that depresses an uppermost semiconductor package of the plurality of semiconductor packages towards the substrate; and
a positioning section that engages with the substrate to position a lowermost semiconductor package onto the wiring pattern.

16. The method of claim 15, wherein each lead frame of the plurality of semiconductor packages comprises a part that extends from the side surface towards an upper surface of each semiconductor package; and
wherein the semiconductor device further comprises a case that is formed by integrating the depressing section and the positioning section.

17. A semiconductor device comprising:
a substrate onto which a wiring pattern is formed;
a plurality of semiconductor packages wherein each semiconductor package comprises a lead frame that is connected to an electrode of a semiconductor chip and the lead frame is located on a side surface and a bottom surface of the semiconductor package, wherein the semiconductor chip comprises a flip chip; and
a pressure-contact section for receiving the plurality of semiconductor packages and for causing the plurality of semiconductor packages to come into contact with the wiring pattern.

18. The semiconductor device of claim 17, wherein the pressure-contact section comprises:
a depressing section that depresses an uppermost semiconductor package of the plurality of semiconductor packages towards the substrate; and
a positioning section that engages with the substrate to position a lowermost semiconductor package onto the wiring pattern.

19. The semiconductor device of claim 18, wherein:
each lead frame of the plurality of semiconductor packages is also located on a top surface of each semiconductor package;
the positioning section comprises a bolt coupled to a lower surface of the substrate; and
the depressing section comprises an adjustable nut that couples to the bolt and adjusts a force to the uppermost semiconductor package.

20. The semiconductor device of claim 17, wherein the pressure-contact section comprises:
a conductive section that is coupled with the wiring pattern; and
a first holding section for each lead frame of the plurality of semiconductor packages.

* * * * *